United States Patent [19]

Nakagawa et al.

[11] Patent Number: 5,070,393
[45] Date of Patent: Dec. 3, 1991

[54] ALUMINUM NITRIDE SUBSTRATE FOR FORMATION OF THIN-FILM CONDUCTOR LAYER AND SEMICONDUCTOR DEVICE USING THE SUBSTRATE

[76] Inventors: Noriko Nakagawa, Yokohama; Takaaki Yasumoto, Kawasaki; Toshio Nakai, Tokyo, all of Japan

[73] Assignee: Kabushiki Kaisha Toshiba, Kawasaki-Shi, Japan

[21] Appl. No.: 454,903

[22] Filed: Dec. 22, 1989

[30] Foreign Application Priority Data

Dec. 23, 1988 [JP] Japan ................................ 63-325345

[51] Int. Cl.⁵ .......................................... H01L 39/02
[52] U.S. Cl. ....................................... 357/80; 357/71; 357/49; 427/96
[58] Field of Search ............... 357/80, 71, 49; 427/96, 427/98; 428/552

[56]  References Cited

U.S. PATENT DOCUMENTS

| 3,967,296 | 6/1976 | Intrator | 357/80 |
| 4,370,421 | 1/1983 | Matsushita | 501/88 |
| 4,761,345 | 8/1988 | Sato et al. | 428/552 |
| 4,886,709 | 12/1989 | Sasame et al. | 428/552 |

Primary Examiner—Rolf Hille
Assistant Examiner—David Ostrowski
Attorney, Agent, or Firm—Foley & Lardner

[57] ABSTRACT

An overcoat layer possessing an insulating property is formed only in the necessary part on a ceramic substrate formed of a sintered aluminum nitride. An aluminum nitride substrate for the formation of a thin-film conductor layer thereon is composed of the ceramic substrate and the overcoat layer both mentioned above. The overcoat layer serves the purpose of alleviating the jogging contour of the surface of the sintered aluminum nitrate and enhancing the smoothness of this surface. A semiconductor device is produced by forming a thin-film conductor layer destined to constitute a circuit part on the overcoat layer. The excellence in the surface smoothness of the overcoat layer enhances the reliability of the thin-film conductor layer in a great measure. Semiconductor elements are mounted on the exposed part of the sintered aluminum nitride where the overcoat layer is absent.

9 Claims, 2 Drawing Sheets

ALUMINUM NITRIDE SUBSTRATE FOR FORMATION OF THIN-FILM CONDUCTOR LAYER AND SEMICONDUCTOR DEVICE USING THE SUBSTRATE

FIELD OF THE INVENTION AND RELATED ART STATEMENT

This invention relates to an aluminum nitride substrate for the formation of a thin-film conductor layer and a semiconductor device using the substrate.

A sintered article of ceramic having aluminum nitride as its main component possesses excellent characteristics such as a highly satisfactory heat radiating property due to a thermal conductivity about five to ten time: as high as that of a sintered article of alumina, a high electric insulating property, a low dielectric constant, and a thermal expansion ratio approximating that of a silicon chip. Thus, it has been attracting keen attention as a material for an insulating substrate for mounting a semiconductor device.

The advance of the trend of semiconductor devices toward increasingly high integration as observed in the recent VLSI's has come to urge the conductor layers formed on the aluminum nitride substrates of the kind described above to undergo a high degree of integration. Thus, a desire is expressed for such conductor layers to form fine wiring therein. As a conductor layer capable of permitting such formation of fine wiring, the thin-film conductor layer which is produced by the thin-film forming method such as a vacuum evaporation method or a sputtering method serves suitably.

When the conductor layer is to be formed by the thin-film forming method, it is the surface condition of the ceramic substrate that matters. The surface of the ceramic substrate possesses a jogging contour due to prominence of ceramic particles. In the formation of the conductor layer by the thin-film method, the jogging contour of the surface of the ceramic substrate exerts a direct influence upon the conductor layer owing to the smallness of its thickness. In the portion having a large difference in level between protuberances and depressions, the conductor layer is deprived of its continuity and is caused to suffer from such drawbacks as disconnection in wiring. The possibility of sustaining disconnection in the wiring gains in fineness.

When the conductor layer is to be formed by the thin-film forming method, therefore, the surface of the ceramic substrate must be amply smoothed as compared with the countertype obtained by the thick-film method, for example. It has been customary heretofore for the thin-film conductor layer to be formed on the surface that has undergone a plurality of steps of grinding and a lapping work intended for impartation of finished smoothness.

The mechanical surface smoothing method described above indeed is capable of attaining overall improvement in surface smoothness and yet susceptible of the problem that, owing to the possible lack of uniformity of grain size of an abradant in use, the surface tends to sustain pits and shed particles and form newly a partially jogging contour. Further, the mechanical surface smoothing method has a disadvantage that the number of component steps of operation is large and the removal from the smoothed surface of the grinding grains used during the grinding work consumes much time. Particularly, in the case of the aluminum nitride substrate, since this ceramic does not so endure to acids and alkalis and susceptible of corrosion as compared with the other ceramics, this substrate has a disadvantage that a restriction is imposed on the selection of a detergent to be used in the removal of grinding grains from the smoother surface. Moreover, the application of wet etching to the substrate of aluminum nitride is restricted to an extent because the aluminum nitride does not so endure to acids and alkalis as described above.

The increasingly high integration of semiconductor devices has been urging the improvement in processing speed of actually mounted parts as a whole. The conductor layer superposed on the ceramic substrate and destined to constitute itself a circuit-forming part, therefore, is required to offer an increasingly high internal signal propagation speed. Since this signal propagation speed is affected by the dielectric constant of the substrate on which the conductor layer is to be superposed, it is desirable that substrate possess a still lower dielectric constant. As a way of decreasing the dielectric constant of the aluminum nitride substrate, there may be conceived a method which effects this decrease by incorporating a glass component in the sintered aluminum nitride, for example. This method, however, entails a disadvantage that the added component increases the thermal expansion coefficient of the sintered mass :nd prevents the characteristics of aluminum nitride from being fully manifested.

OBJECT AND SUMMARY OF THE INVENTION

An object of this invention, therefore is to provide an aluminum nitride substrate having the surface thereof precluded from sustaining pits and shedding loose particles under the influence of an external force, improved in smoothness, and allowed to offer enhanced reliability for the sake of the super-position of a thin-film conductor layer thereon.

Another object of this invention is to provide an aluminum nitride substrate improved further in various electric properties including dielectric constant.

A further object of this invention is to provide a semiconductor device which is capable of curbing the occurrence of defects in a thin-film conductor layer incorporating a circuit of fine wiring therein and imparting enhanced reliability to the overall operation of actually mounted semiconductor elements.

The aluminum nitride substrate of this invention to be used for forming a thin-film conductor layer comprises a ceramic substrate of a sintered aluminum nitride and an insulating overcoat layer covering the necessary part of the surface of the ceramic substrate.

The semiconductor device of this invention comprises a ceramic substrate formed of a sintered aluminum nitride, an insulating overcoat layer covering the surface of the ceramic substrate in such a manner that part of the sintered aluminum nitride will remain as an exposed part, a thin-film conductor layer superposed on the insulating overcoat layer and possessed of a required circuit configuration, and semiconductor elements mounted on the exposed part of the ceramic substrate.

Since the aluminum nitride substrate of this invention has the overcoat layer formed on the necessary part of the ceramic substrate, it avoids necessity of undergoing a work of grinding aimed at improving surface smoothness and, therefore, allows elimination of infliction of pits and separation of loose particles otherwise caused by the impact of the work of grinding. The overcoat layer serves to enhance the smoothness of the surface of the aluminum nitride substrate. Further, this overcoat layer avoids impairing the outstanding thermal properties possessed by aluminum nitride because it is formed in other than the part for mounting the semiconductor elements.

The reliability of the thin-film conductor layer is improved to a great extent by the fact that the thin-layer conductor layer is superposed on the overcoat layer which excels in surface smoothness as described above. In other words, the occurrence of drawbacks such as disconnection of wiring can be prevented. Further, the thickness of the film is not required to be increased for the purpose of precluding the occurrence of such drawbacks as disconnection of wiring, for example. An increase in the thickness of film is liable to encourage the occurrence of film separation and bring about an addition to cost.

DETAILED DESCRIPTION OF PREFERRED EMBODIMENTS

Now, this invention will be described below with reference to working examples illustrated in the accompanying drawings.

Figure 1:
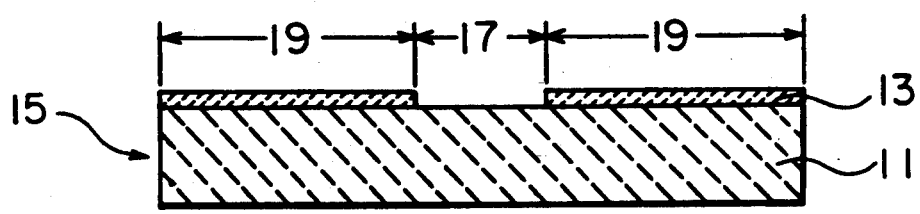
FIG. 1 is a cross section illustrating an aluminum nitride substrate as one embodiment of this invention.

FIG. 1 is a cross section illustrating an aluminum nitride substrate for the formation of a thin-film conductor layer as one embodiment of this invention.

In the diagram 11 stands for an insulating ceramic substrate formed of a sintered aluminum nitride. The sintered aluminum nitride mentioned above is produced by using as a starting material a mixed power prepared by adding to aluminum nitride powder a compound of a rare earth element such as yttrium oxide and/or a compound of an alkaline earth element such as calcium oxide. The compounds of rare earth elements and alkaline earth elements contemplated herein are not limited to oxides. They embrace silicides, carbides, fluorides, and substances which are enabled by heating to produce such compounds. The amount of the sintering auxiliary to be added is desired to be approximately in the range 0.1 to 20% by weight. The ceramic substrate 11 formed of the sintered aluminum nitride described above is produced by mixing the starting material described above with an organic binder, molding the resultant mixture in a described shape by the doctor blade process, and sintering the shaped mixture under pressureless sintering or under gas pressure sintering. The production may be accomplished by employing a sintering method such as a hot press method.

On the main surface of the ceramic substrate 11, an overcoat layer 13 for insulating is superposed where necessary. An aluminum nitride substrate 13 for the formation of a thin-film conductor layer is composed of the ceramic substrate 11 and the overcoat layer 13.

The overcoat layer 13 mentioned above may be a glass layer, a resin layer of polyimide resin or fluorine-containing resin, or a ceramic layer like a thin-film aluminum nitride layer. The overcoat layer 13 covers a thin-film conductor-forming region 19 of the surface of the ceramic substrate 11 except for a position 17 for mounting semiconductor elements. In other words, in the position 17 for mounting semiconductor elements on the ceramic substrate 11, the surface of the sintered aluminum nitride is directly exposed. This arrangement is aimed at permitting ample manifestation of the excellent thermal conductivity characteristic of the sintered aluminum nitride by enabling semiconductor elements to be mounted directly on the sintered aluminum nitride. This is because the overcoat layer 13 functions as a substance capable of inhibiting conduction of heat when the semiconductor elements are mounted on the insulating overcoat layer 13.

Though the thickness of the overcoat layer 13 is variable with the material used therefor, it is desired to be not less than 50 nm in view of the desirability of improving the smoothness of the ceramic substrate 11. If this thickness is increased to any excess, the excess brings about no proportionate addition to the effect and rather causes such drawbacks as layer separation. For practical purpose, therefore, this thickness is desired to be not more than 30 μm.

Figure 2:
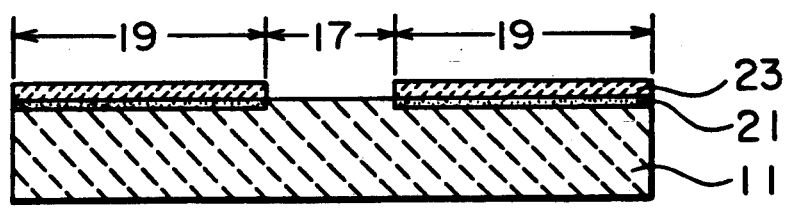
FIG. 2 is a cross section illustrating an aluminum nitride substrate as another embodiment of this invention.

When a glass layer is used as the overcoat layer 13, the glass layer 23 is formed as an overcoat layer on an aluminum oxide layer 21 which has been formed by oxidizing the ceramic substrate 11 in advance as illustrated in FIG. 2. The aluminum oxide layer 21 can be easily formed by heating the sintered aluminum nitride in an oxidizing atmosphere to a temperature in the range of 1,000° to 1,300° C. This aluminum oxide layer 21 is desired to be formed in the part 19 excluding the position 17 for mounting semiconductor elements.

The aluminum oxide layer 21 is intended to preclude the otherwise possible occurrence of a gas during the course of the formation of the glass layer 23 and to improve a joining state between the ceramic substrate 11 and the glass layer 23. Depending on the particular method employed for the formation of the glass layer 23, the necessity for the aluminum oxide layer 21 may be obviated.

The aluminum nitride substrate 15 for the formation of a thin-film conductor described above is produced as follows, for example.

First, the method for producing the aluminum nitride substrate 15 using a glass layer 23 as an insulating overcoat layer will be described.

The portion of the surface of the ceramic substrate 11 formed of a sintered aluminum nitride corresponding to the position 17 for mounting semiconductor elements is masked. Then, the ceramic substrate 11 is heated in an oxidizing atmosphere to about 1,300° C. to oxidize the thin-film conductor-forming region 19 of the surface of the ceramic substrate 11 and consequently give rise to the aluminum oxide layer 21.

Next, a glass paste using glass powder having a softening temperature approximately in the range of 300° to 800° C. is applied by the screen printing process on the surface of the aluminum oxide layer 21. The glass paste to be used herein may be made of a $SiO_2$ type glass having $SiO_2$ as a principal component and additionally containing BaO, CaO, and $Al_2O_3$, for example. By subsequently firing the applied layer of glass paste, an insulating overcoat layer of the glass layer 23 is formed.

In this case, when the insulating overcoat layer formed of the glass layer 23 is directly superposed on the sintered aluminum nitride, it is surmised that the reaction occurring during the course of the firing will generate N$_2$ gas and impair the surface quality of the glass layer 23. In the present embodiment, since the glass layer 23 is formed on the aluminum oxide layer 21, the reaction during the course of the firing is suppressed and the generation of gas is therefor prevented. As the result, the glass layer 23 so produced possesses a smooth surface and is jointed fast to the substrate.

Alternatively, the sol gel method may be employed for the formation of the glass layer 23. In this case, the ceramic substrate 11 is first immersed in an alkoxide solution of low viscosity formulated to give rise to a SiO$_2$ glass, for example. Then, the ceramic substrate 11 is lifted from the solution and exposed to the ambient air to induce hydrolysis of the alkoxide adhering to the surface. Thereafter, the substrate proper now covered with the hydrolyzed alkoxide is heated at a low temperature approximately in the range of 100° to 500° C. to gel the adhering layer of hydrolyzed alkoxide and give rise to the glass layer 23. The alkoxide solution to be used herein may be composed of Si(OC$_2$H$_5$)$_4$, C$_2$H$_5$OH, H$_2$O, and HCl, for example.

The aluminum nitride substrate 15 for the formation of a thin-film conductor layer in the present embodiment is allowed to have the jogging contour of its surface alleviated without requiring any surface treatment because it :as the surface thereof covered with the overcoat layer formed of the glass layer 23 as described above. When a conductive layer is formed thereon by the thin-film forming process such as the sputtering process or the vacuum evaporation process, therefore, the percent defective (number of defects such as those of disconnected wiring) is extremely small.

Now, the method for producing the aluminum nitride substrate 15 using a resin layer as the insulating overcoat layer 13 will be described below.

Similarly to the preceding case using the glass layer, the portion of the surface of the ceramic substrate 11 corresponding to the position 17 for mounting semiconductor elements is masked. Then, the solution of resin such as polyimide resin or a fluorine-containing resin represented by Teflon (proprietary product) is applied to the masked surface by the spin coating process, for example. The coating layer of this resin is fastened to the underlying surface as by a heat-treatment, for example, to give rise to the overcoat layer 13 formed of resin. The polyimide layer may be formed by the spin coating process as follows. First, polyamic acid as the precursor for polyimide is prepared by subjecting a tetracarboxylic acid component and a diamine component to a ring-opening polyaddition reaction. Then, a varnish having a viscosity approximately in the range of 30 to 1,000 cp is produced by dissolving the polyamic acid in a suitable organic solvent. The polyamic acid varnish is applied by the spin coating process on the masked ceramic substrate 11 and the applied coating of the varnish is fired or cured to produce the polyimide layer. The spin coating method used herein is highly effective in alleviating the jogging contour of the surface.

Alternatively, the resin layer may be formed by the sputtering process. Specifically, a polyimide resin or a fluorine-containing resin is used as the target and an inert gas such as argon or nitrogen is used as the sputtering gas. The insulating overcoat layer 13 is formed by feeding a RF electric power approximately in the range of 100 W to 500 W to the target under a vacuum approximately in the range of 0.1 Pa to 2 Pa thereby inducing the phenomenon of sputtering and effecting deposition of the target resin on the ceramic substrate 11 formed of the sintered aluminum nitride held at the room temperature.

When the overcoat layer 13 of resin is formed on the ceramic substrate 11 as described above, the jogging contour of the surface can be alleviated without requiring any surface treatment. When a conductor layer is superposed thereon by the thin-film forming process such as the sputtering process or the vacuum evaporation process, therefore, the percent defective (number of defects such as disconnection of wiring) is extremely small.

When a ceramic layer is to be formed as the overcoat layer 13, the formation of this ceramic layer is formed by employing the sputtering method similarly to the preceding case using a resin layer. Where a thin film of aluminum nitride is to be formed by the sputtering method, for example, a sintered aluminum nitride or aluminum is used as the target. When the sintered aluminum nitride is adopted as the target, the formation of the overcoat layer 13 is accomplished by feeding a RF electric power approximately in the range of 100 W to 500 W to the target in the sputtering gas in the state of a vacuum of argon or nitrogen approximately in the range of 0.1 Pa to 2 Pa thereby inducing the phenomenon of sputtering and the deposition of aluminum nitride on the ceramic substrate 11 heated to a temperature approximately in the range of room temperature to about 200° C. When aluminum is used as the target, the formation of the overcoat layer 13 is attained by effecting a reactive sputtering in an atmosphere of nitrogen gas mixed with argon gas and inducing the deposition of aluminum nitride.

Now, an embodiment of the semiconductor device using the aluminum nitride substrate 15 of the preceding embodiment for the formation of a thin-film conductor will be described.

Figure 3:
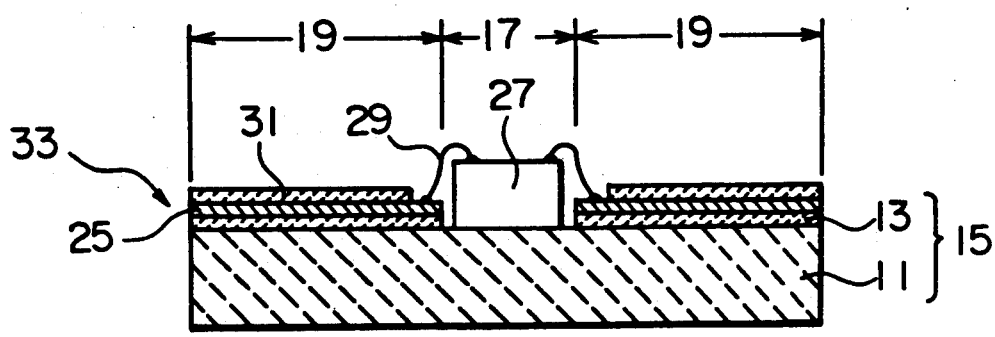
FIG. 3 is a cross section illustrating a semiconductor device as one embodiment of this invention.

FIG. 3 is a cross section illustrating a typical semiconductor device as one embodiment of this invention. On the overcoat layer 13 consist of the polyimide resin on the aluminum nitride substrate 15 for the formation of a thin-film conductor, a thin-film conductor layer 25 possessing a required circuit pattern is formed as by the sputtering process or the vacuum evaporation process. The material for this thin-film conductor layer 25 is desired to be a metal such as gold, silver, copper, platinum, or aluminum which is a good conductor for electricity. Optionally, the thin-film conductor layer 25 may be formed in a multilayer structure obtainable by superposing on the overcoat layer 13 a layer of an active element such as titanium, chromium, tungsten, or zirconium as a junction layer and forming thereon either directly or through the medium of a barrier layer of nickel or palladium a layer of the aforementioned metal which is a good conductor for electricity. The material for the thin-film conductor layer 25 may be suitably selected depending on the purpose for which the semiconductor device is used or the material of the overcoat layer 13.

At position 17 for directly exposing the surface of the sintered aluminum nitride and consequently allowing semiconductor elements 27 to be mounted thereon, semiconductor elements 27 are mounted fast as by soldering. The electrodes of the semiconductor elements 27 are electrically connected to the thin-film conductor layer 25 with a bonding wire 29, for example. The thin-film conductor layer 25 is covered with protect layer 31 identical or not identical with the material of the overcoat layer 13 mentioned above except bonding section. This structure of the semiconductor device 33. This structure of the semiconductor device is not changed even when the glass layer 13 superposed on the aluminum oxide layer 21 is utilized as the overcoat layer 13.

When the thin-film conductor layer 25 is formed on the overcoat layer 13 excelling in surface smoothness as described above, the percent defective (number of defects such as disconnection of wiring) is lowered to a great extent.

Further, in the semiconductor device 33 described above, the thickness of the film can be amply decreased and, at the same time, the magnitude of resistance can be lowered by improving the smoothness of the thin-film conductor layer 25 itself. If a jogging contour occurs in the thin-film conductor layer 25, for example, it will augment the effective value of the electric current path and increase the magnitude of resistance. If the thickness of film is increased for the purpose of precluding these adverse phenomena, such defects as layer separation tend to occur and the reliability of performance is impaired.

Further, since the semiconductor elements 27 are mounted directly on the part 17 through which the surface of the sintered aluminum nitride is exposed, the heat generated in the semiconductor elements 27 is diffused rapidly in the direction of the sintered aluminum nitride and the occurrence of defects due to increase in temperature can be curbed.

By forming the thin-film conductor layer 25 on the overcoat layer 13 in the manner described above, the reliability of the thin-film conductor layer 25 is improved in a large measure and the reliability of the device as a whole is enhanced consequently. This effect is not changed when the glass layer 23 formed on the aluminum oxide layer 21 is utilized as the overcoat layer 13.

Incidentally, the dielectric constant of polyimide resin is about 3.5 to 3.9, that of Teflon is about 2.0 to 2.1, and that of the sintered aluminum nitride is about 8.8 (1 MHz). The signal propagation speed V in the thin-film conductor layer 25 is determined by the following formula:

$$V = \frac{C}{\sqrt{\epsilon}}$$

C: light velocity,
ϵ: relative dielectric constant

From this fact, it is logically inferred that the signal propagation speed can be enhanced by forming the overcoat layer 13 with polyimide resin or Teflon ("Teflon" is the trademark for polytetrafluroethylene resin. The enhancement of the signal propagation speed can be similarly obtained by forming the glass layer 23 with quartz glass. In other words, the signal propagation speed can be controlled by suitably selecting the material of which the overcoat layer 13 is made. From this fact, it is logically concluded that the semiconductor device of this invention promises a marked increase in processing speed.

Figure 4:
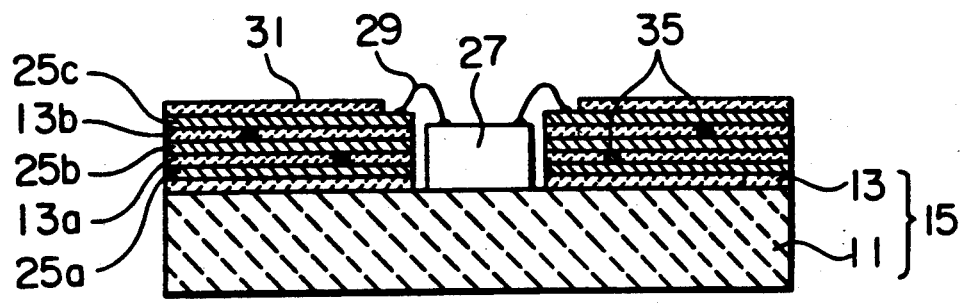
FIG. 4 is a cross section illustrating a semiconductor device as another embodiment of this invention.

The overcoat layer 13 and the thin-film conductor layer 25 are not always required to be formed one each. Optionally, the circuit may be formed in a multilayer structure which, as illustrated in FIG. 4, is obtained by alternately superposing overcoat layers 13 (13, 13a, and 13b) and thin-film conductor layers 25 (25a, 25b, and 25c). In this case, the overcoat layers 13a and 13b in the intermediate part may be made of a material identical or not identical with the material of the lowermost overcoat layer 13. The thin-film conductor layers 25a, 25b, and 25c are electrically connected by virtue of a through hole 35.

Also in the semiconductor device of the multilayer structure described above, the reliability of the individual thin-film conductor layers 25a, 25b, and 25c is improved in a large measure and the reliability of the device as a whole is consequently enhanced.

What is claimed is:

1. An aluminum nitride substrate for forming a semiconductor device thereon, comprising:

a ceramic substrate of sintered aluminum nitride, the surface of said ceramic substrate including a region for mounting a semiconductor element on the surface of said ceramic substrate and a region for forming a thin-film conductor layer surrounding said region for mounting said semiconductor element;

an insulating layer formed on said region for forming said thin-film conductor layer;

a thin-film conductor layer formed on said region for forming said thin-film conductor layer such that said region for forming said thin-film conductor layer is interposed between said thin-film conductor layer and said ceramic substrate and said thin-film conductor layer does not contact said ceramic substrate; and, an exposed aluminum nitride surface of said ceramic substrate for mounting a semiconductor element.

2. The aluminum nitride substrate according to claim 1, wherein said insulating layer is formed of at least one member selected from the group consisting of glass layer, resin layer, and ceramic layer.

3. The aluminum nitride substrate according to claim 1, wherein said insulating layer is formed of a glass layer, said glass layer being formed on an aluminum oxide layer which is formed by the oxidation of the surface of said region for forming said thin-film conductor layer of said sintered aluminum nitride substrate.

4. A semiconductor device comprising:

a ceramic substrate of sintered aluminum nitride, the surface of said ceramic substrate including a region for mounting a semiconductor element on the surface of said ceramic substrate and a region for forming a thin-film conductor layer surrounding said region for mounting said semiconductor element;

an insulating layer formed on said region for forming a thin-film conductor layer;

an exposed aluminum nitride surface of said ceramic substrate for mounting a semiconductor element within said region for mounting said semiconductor element;

a thin-film conductor layer formed on said insulating layer, said thin-film conductor layer having an electrical wiring pattern; and a semiconductor element mounted on said exposed aluminum nitride layer, said semiconductor element having a plurality of electrodes for electrically connecting said semiconductor element to said electrical wiring pattern with a plurality of bonding wires.

5. The semiconductor device according to claim 4, wherein said insulating overcoat layer is formed of at least one member selected from the group consisting of glass layer, resin layer, and ceramic layer.

6. The semiconductor device according to claim 4, wherein said insulating layer is formed of a glass layer, said glass layer being formed on an aluminum oxide layer which is formed by the oxidation of the surface of said region for forming said thin-film conductor layer of said sintered aluminum nitride substrate.

7. The semiconductor device according to claim 4, wherein a plurality of said insulating layers and a plurality of said thin-film conductor layers are alternately superposed to form a multilayer wiring.

8. The aluminum nitride substrate according to claim 4, wherein said insulating layer is formed of a glass layer, said glass layer being formed on an aluminum oxide layer which is formed by the oxidation of the surface of said region for forming said thin-film conductor layer of said sintered aluminum nitride substrate.

9. The semiconductor device according to claim 8, wherein said insulating layer is formed of a glass layer, said glass layer being formed on an aluminum oxide layer which is formed by the oxidation of the surface of said region for forming said thin-film conductor layer of said sintered aluminum nitride substrate.

* * * * *